United States Patent [19]

Steranko

[11] 4,272,007
[45] Jun. 9, 1981

[54] WIRE BONDING SYSTEM AND METHOD

[76] Inventor: James J. Steranko, 33 Rockport Rd., Weston, Mass. 02193

[21] Appl. No.: 8,876

[22] Filed: Feb. 2, 1979

[51] Int. Cl.³ .................. H05K 13/06; B23K 1/12
[52] U.S. Cl. .................................. 228/213; 228/4.5
[58] Field of Search .................. 228/4.5, 44.1 A, 9, 228/179, 213; 29/850, 854

[56] References Cited

U.S. PATENT DOCUMENTS

| | | | |
|---|---|---|---|
| 3,125,906 | 3/1964 | Johnson | 228/4.5 |
| 3,659,770 | 5/1972 | Miller | 228/8 X |
| 3,673,681 | 7/1972 | Steranko | 228/4.5 X |
| 3,724,264 | 4/1973 | Lac Valle | 29/407 X |
| 3,812,581 | 5/1974 | Larson et al. | 228/4.5 X |
| 3,840,169 | 10/1974 | Steranko et al. | 228/4.5 |

Primary Examiner—Gil Weidenfeld
Assistant Examiner—Kenneth J. Ramsey
Attorney, Agent, or Firm—Joseph S. Iandiorio

[57] ABSTRACT

A bonding system comprising a solder head; a tip unit for receiving wire to be soldered; a heater for heating the tip unit; drive means for moving the head toward and away from a member to be soldered and for increasing the force of the tip unit on the member to be soldered; means for enabling the drive means to move the tip unit to engage the member and to energize the heater for a predetermined period of time; and means for enabling said drive means to increase for a lesser period of time, during said predetermined period of time, the force between the tip unit and member.

11 Claims, 6 Drawing Figures

WIRE BONDING SYSTEM AND METHOD

FIELD OF INVENTION

This invention relates to an improved bonding system.

BACKGROUND OF INVENTION

Bonding systems, such as those used in automatic wiring machines, often produce poor connections due to oxide coatings and insufficient thermal contact. In addition, the connection quality is often inconsistent from board to board and even from point to point on a single board. An attempt to solve some of the problems by increasing the tip to contact pressure is not wholly adequate because the solder is squashed out of the connection, and the wire, contact, or other members to be soldered may become deformed. Poor connections also result from contaminated solder tips. Typically the tips become clogged with solder deposits and impurities and must be periodically cleaned. Since the tips are used on heads in groups of typically six or more operated together, any interruption for cleaning of one tip stops production on all of the associated heads. The wire must be removed from the tip and the tip cleaned out; often the contamination is such that the tip has to be removed from the head and chemically and mechanically cleaned with tools and solvents.

SUMMARY OF INVENTION

It is therefore an object of this invention to provide an improved bonding system which produces uniformly better solder connections.

It is a further object of this invention to provide such an improved bonding system which improves thermal transfer between the parts during soldering.

It is a further object of this invention to provide such an improved bonding system which removes oxide coatings from and increases thermal conduction between the parts being soldered.

It is a further object of this invention to provide such an improved bonding system which facilitates threading of wire into the tip.

It is a further object of this invention to provide such an improved bonding system which provides continuous cleaning of the tip.

It is a further object of this invention to provide such an improved bonding system which facilitates periodic cleaning of the tip without removing the wire from the tip or the tip from the head.

It is a further object of this invention to provide such an improved bonding system which automatically tests each connection and rebonds any connection that fails the test.

The invention results from the realization that a truly improved bonding system and method can be effected by applying a momentary increase in force at the connection at the beginning of the bonding cycle and releasing the force before the bonding cycle is completed, thereby breaking through oxides and other interfering films and increasing initial contact pressure, and by using a tip ministering assembly which is capable of threading the wire into the tip and cleaning the tip periodically and continuously without removing the wire from the tip or the tip from the head, and testing each connection and rebonding those that fail.

This invention features a bonding method and system which includes a solder head and a tip unit for receiving wire to be soldered. There is a tip heater for heating the tip unit and drive means for moving the head toward and away from the member to which the wire is to be soldered, and for increasing the force of the tip unit on the wire and member to be soldered. There are means enabling the drive means to move the tip unit to engage the member and to energize the heater for a predetermined period of time. There are also means for enabling the drive means to increase for a lesser period of time, during the predetermined period of time, the force between the tip unit and member.

The invention also features a tip assembly included in the tip unit and having a first passage through it for receiving the wire, and a tip ministering assembly with a second passage for receiving the wire and leading it to the first passage. There are holding means, for mounting proximate the tip assembly, the tip ministering assembly in a retracted position after threading with the wire still passing through it to the tip assembly. The tip ministering assembly may include a cutting edge at its lower end for cleaning the passage in the tip assembly without removing the wire. The tip ministering assembly may also include an enlarged upper end to facilitate its own acceptance of the wire, and a reservoir, also at its upper end, for carrying cleaning solvent for delivery to the first through the second passage between the tip ministering assembly and the wire passing through it. The holding means may include magnetic means on the head and on the tip ministering assembly.

The invention also includes a method of bonding wire to a contact including moving a solder head to engage a wire in its tip with a contact to which it is to be bonded. The soldering tip is then heated to heat the wire and contact and cause the solder to flow. A force is applied to increase the pressure of the tip on the wire and contact. The force is then removed along with the heating applied to the tip, and the solder head moved away from the tip and contact.

The invention also relates to a bonding system which has a solder head having a soldering tip for making a bond, a bendable beam fixed to the head, sensor means actuated by the beam for indicating the condition of the bond, and a gripping device fixed to the beam for gripping wire fed through the tip. There are automatic cycling means which include means for driving the solder head to engage the tip with the contact, means for heating the tip for a predetermined period of time, and means for actuating the gripping device and retracting the solder head after the period of time. There are means for actuating the automatic cycling means initially and means responsive to the means for sensing for reactuating the cycling means upon the sensing means indicating an inadequate bond.

DISCLOSURE OF PREFERRED EMBODIMENT

Other objects, features and advantages will occur from the following description of a preferred embodiment and the accompanying drawings, in which.

The invention may be accomplished with a bonding system that includes a soldering head and a tip unit for receiving wires to be soldered. A heater heats the tip unit and some drive means, such a motor-driven cam and follower unit, is used to move the head toward and away from the member or contact to be soldered. There are also means for increasing the force of the tip unit on the member to be soldered, which may either be a second, additional drive or the same drive, for example an additional lobe on the cam in conjunction with an additional cam means or a spring. Additionally there are means such as timing circuits for enabling the drive means to move the tip unit to engage the member to be soldered and to energize the heater for a predetermined period of time, Typically two seconds. There are also means for enabling the drive means to increase, for a lesser period of time, for example one-tenth to one second, the force between the tip and the member.

The tip unit may include a tip assembly and a tip ministering assembly. The tip assembly has a first passage through it and the tip ministering assembly has a second passage through it for receiving a wire for insertion into the first passage of the tip assembly. There are holding means for mounting proximate the tip assembly the tip ministering assembly in the retracted position after the threading has been accomplished and with the wire still passing through it to the tip assembly. The tip ministering assembly may include a cutting edge at its lower end for cleaning the passage in the tip assembly without removing the wire. The tip ministering assembly may include an enlarged upper end for accepting the wire and in fact may have a reservoir at its upper end for carrying cleaning solvent for delivery to the first passage through the second passage between the tip ministering assembly and the wire therein. In fact, the tip ministering assembly may be simply a hypodermic needle whose end is cut at a diagonal to increase sharpness and provide a cutting edge, and whose enlarged upper end functions as a reservoir. The wire passing through the hypodermic needle acts to meter the flow of the solvent between it and the passage through the hypodermic needle. The holding means typically includes a magnetic material on the tip ministering assembly which cooperates with a magnet mounted to the head.

Figure 1:
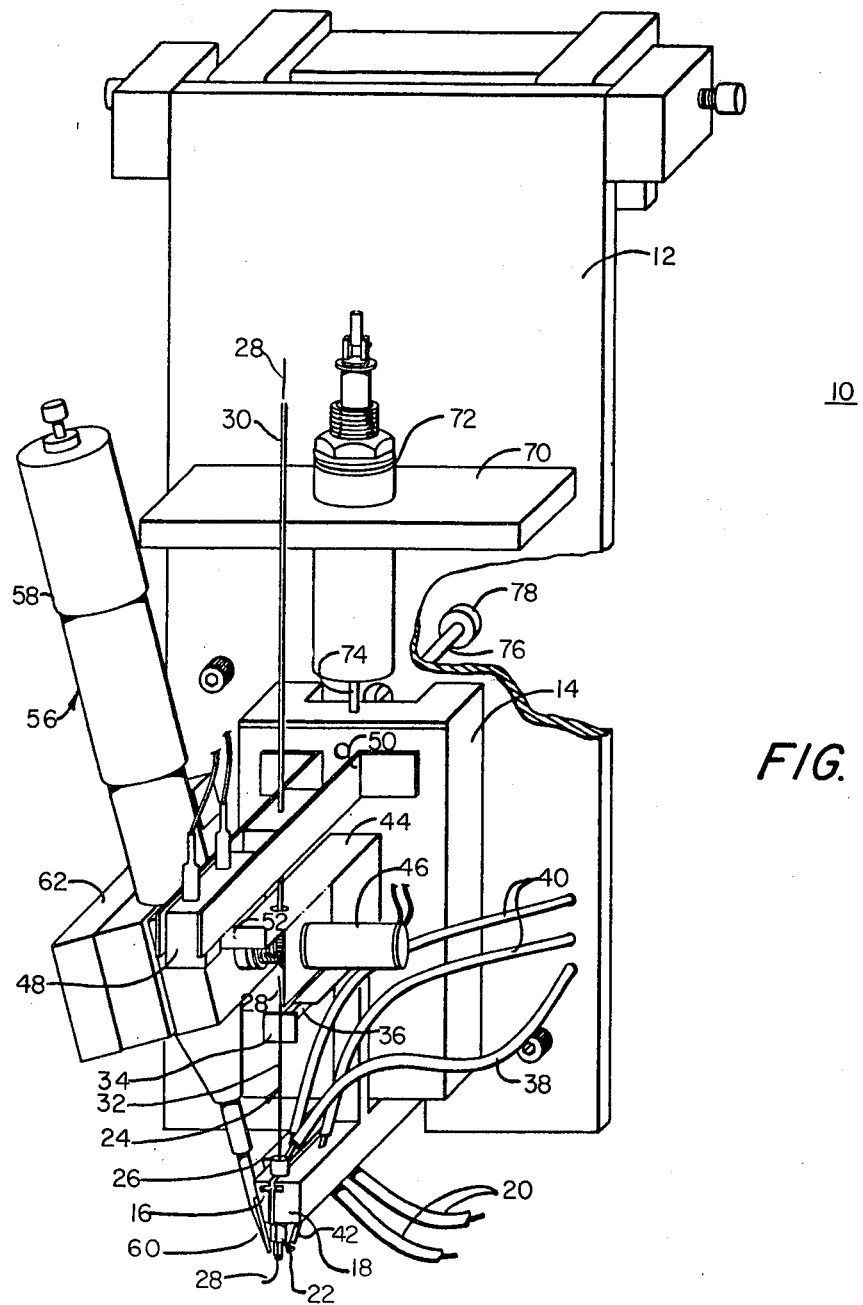
FIG. 1 is an axonometric diagram of a portion of a bonding system according to this invention.

There is shown in FIG. 1 a solder head 10 including a frame 12 on which is slidably mounted drive block 14, which carries at its lower end a pair of electrodes 16 and 18 that receive power through wires 20 to heat tip assembly 22. Tip assembly 22 and tip ministering assembly 24 comprise tip unit 26, which receives wire 28 extending from a supply, not shown, through feed conduit 30 and out the bottom of tip 22.

Tip ministering assembly 24 includes a hollow tube 32 and a pad 34 of a magnetic material which is attracted and held by a magnet 36 fixed to drive block 14. Tube 38 provides cooling fluid to the interior of tip assembly 22 to keep cool all but the very end of the tip and prevent insulation from sublimating except at the tip. Tubes 40 provide cooling fluid through pipes 42, only one of which is visible, to cool the connection after it has been formed.

A flexible calibrated beam 44 is fixed to drive block 14 and carries on it a gripping solenoid 46, which when actuated grips wire 28 passing through its jaws and firmly, positively holds wire 28 without slippage. Microswitch 48 mounted on arm 50 is actuated by tab 52 of beam 44. Solder head 10 also includes a cutting mechanism 56, which includes a drive solenoid 58 that drives cutting edge 60 to cut wire 28 at the end of the run. Wire cutting mechanism 56 is mounted to block 62 which is mounted to frame 12.

Frame 12 also includes a mounting 70 which carries solenoid 72 that provides through its plunger 74 when actuated a momentary increase in force applied through tip assembly 22 to the contact and wire to be bonded.

Figure 2:
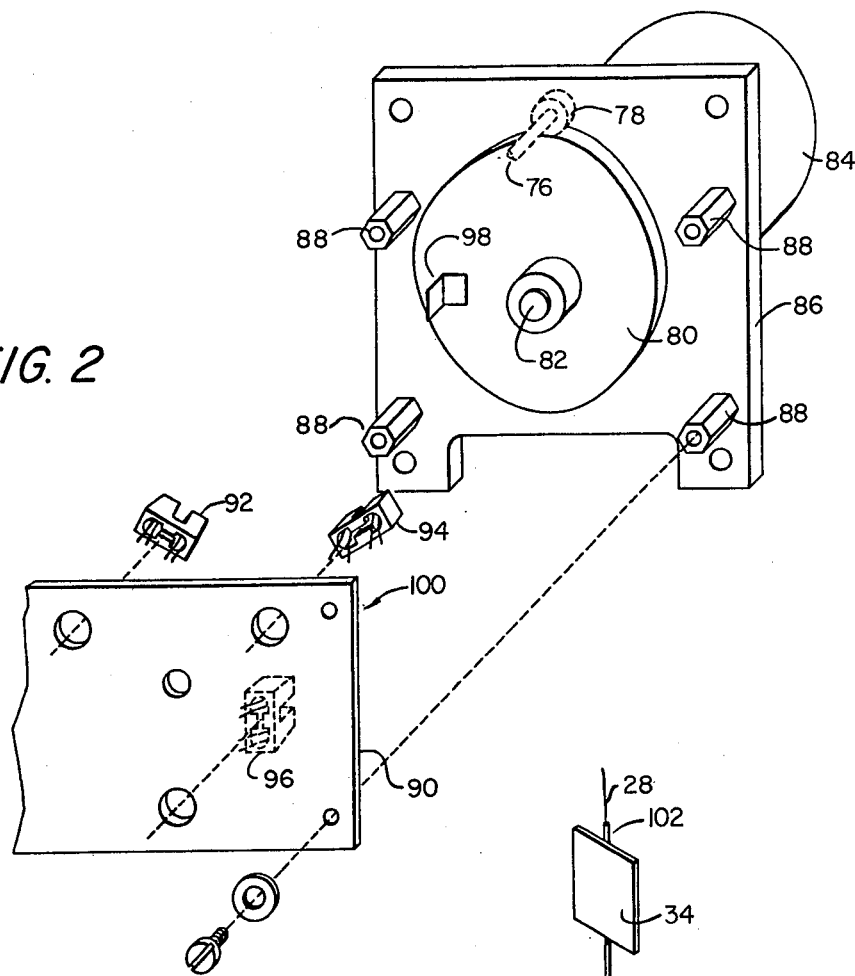
FIG. 2 is an exploded axonometric view of a drive mechanism to operate the soldering head of FIG. 1.

Drive block 14 also includes a rod 76 which extends through frame 12 and contains on its end cam followe 78 that engages with and is driven by cam 80, FIG. 2, mounted on shaft 82 driven by motor 84 mounted on plate 86 by means not visible. Also mounted on plate 86 are four spacers 88, which receive a mounting board 90 on which are located three photoelectric sensing units 92, 94, and 96 which sense the presence of tab 98 on cam 80 as it rotates. Photoelectric units 92, 94 and 96 form a part of the head position sensor circuit 100, which detects three positions of drive block 14. The first or "0" position when tip assembly 22 is engaged with the contact to be bonded; the second or "1" position when drive block 14 has been raised a predetermined amount for testing the bonds and for moving from one bond to the next; and a third position, position "2".

Figure 3:
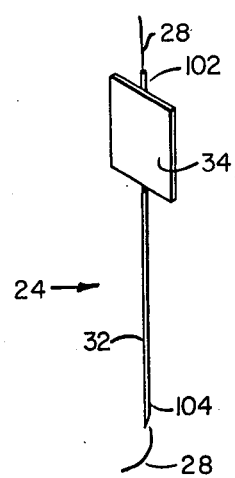
FIG. 3 is an axonometric view of the tip ministering assembly of FIG. 1.

Tip ministering assembly 24 may include a flared upper end 102, FIG. 3, for facilitating easy insertion of wire 28 during threading. Tube 32 may include a sharpened or diagonally cut lower end 104 to aid in its function of cleaning tip assembly 22, which will be explained more fully in connection with FIG. 5

Figure 4:
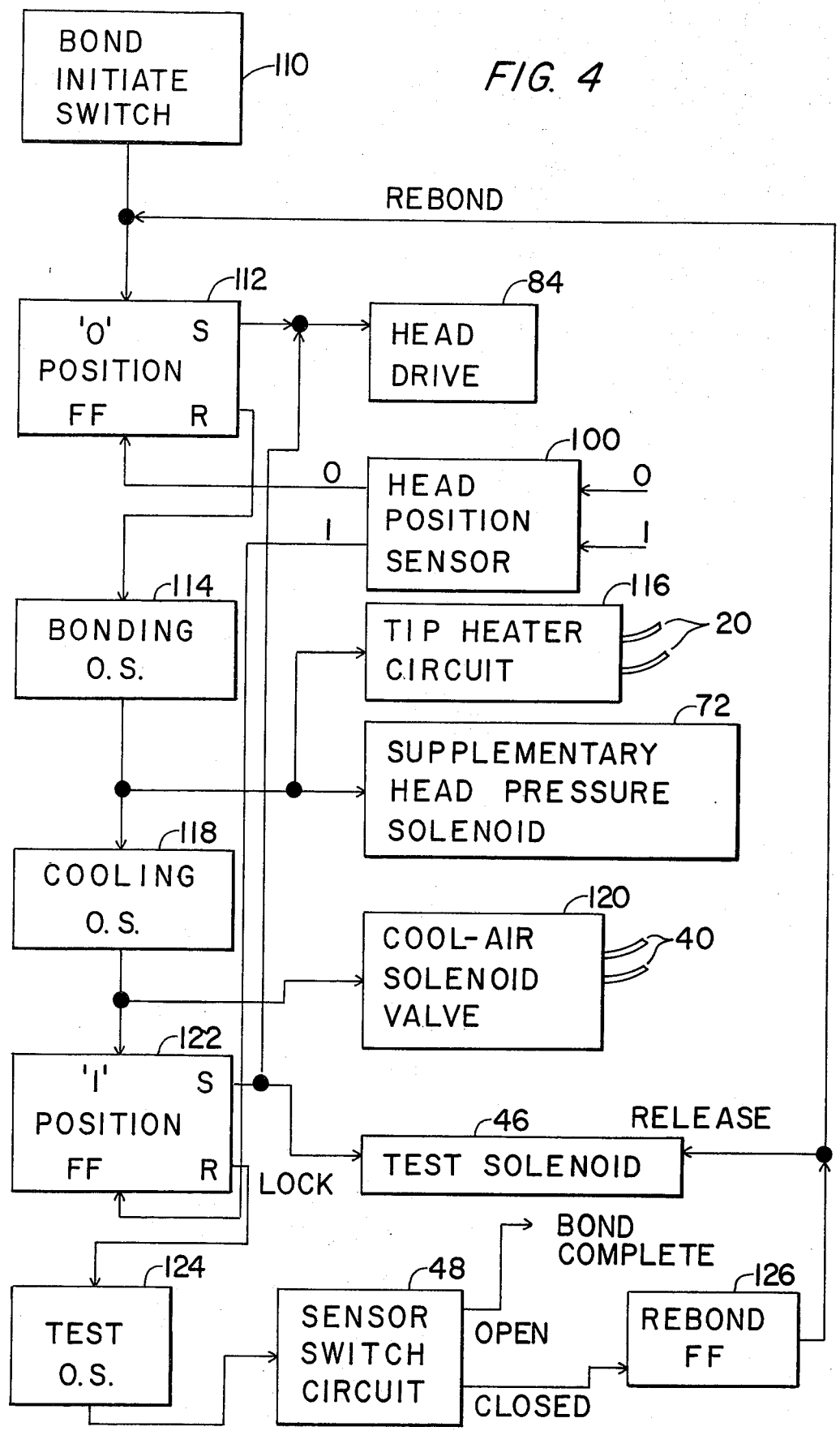
FIG. 4 is a block diagram of a bonding system according to this invention.

In operation, a bond initiation switch 110, FIG. 4, is operated to set "0" position flip-flop 112, whose set output operates head drive motor 84 to rotate cam 80 and move drive block 14. When head position sensor circuit 100 senses that the head is in the "0" position, it supplies a reset signal to flip-flop 112 which then actuates bonding one shot circuit 114. This energizes tip heater circuit 116, which supplies power through cables 20 to electrodes 16 and 18. Circuit 114 also provides power to solenoid 72 to extend plunger 74 and momentarily increase the force on drive block 14 and tip assembly 22. The force exerted by plunger 74 is momentary only in comparison to the overall cycle time. For example, the force applied by solenoid 72 is for approximately 0.2-1 second when the full cycle time, that is the period beginning when flip-flop 112 moves tip assembly 22 into the "0" position and ending when flip-flop 122 moves into the "1" position, is 2 seconds. At the end of the period determined by circuit 114, cooling one shot circuit 118 is operated to energize cool air solenoid valve 120 for a period of time and supply cool air through tubes 40 to cool the connection just made. At the end of that period of time circuit 118 sets the "1" position flip-flop 122, which provides a signal to test solenoid 46 to lock up and secure wire 28 and also a signal to head drive motor 84 to drive cam 80 and so move drive block 14. When drive block 14 has risen to the "1" position a signal from head position circuit 100 resets it. At this point, with the test solenoid 46 locked on wire 28, the head has risen from position "0" to position "1". If the bond made is a good one wire 28, held at the bond point and by solenoid 46, causes beam 44 to deflect and its tab 52 to move away from switch 48. If the bond is not good, wire 28 pulls away from the connection, beam 44 is not deflected, and tab 52 stays in contact with switch 48.

The resetting of flip-flop 122 operates test on shot circuit 124, which strobes switch circuit 48 to determine its condition. In this construction, if the switch is open at this point the bond is determined to be complete, but if the switch is closed the bond is determined to have failed, and this causes rebond flip-flop 126 to be set. The output of rebond flip-flop 126 sends a signal to test solenoid 46, causing it to release wire 28 form its grip, while at the same time a rebond signal is sent to the input of flip-flop 112 and the bonding cycle is automatically begun again.

Figure 6:
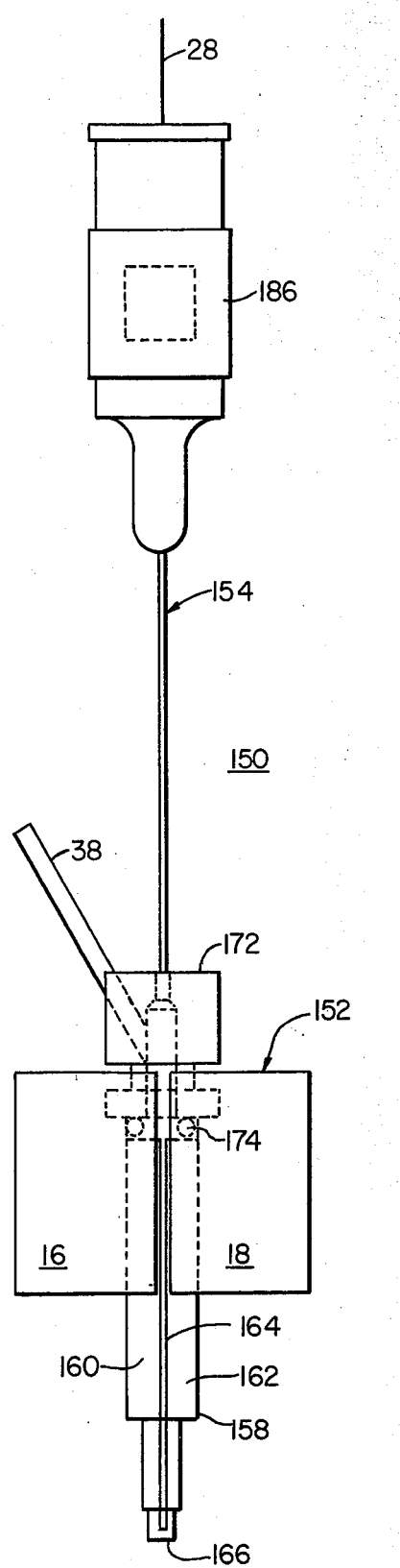
FIG. 6 is a front view of the tip unit of FIG. 5.
Figure 5:
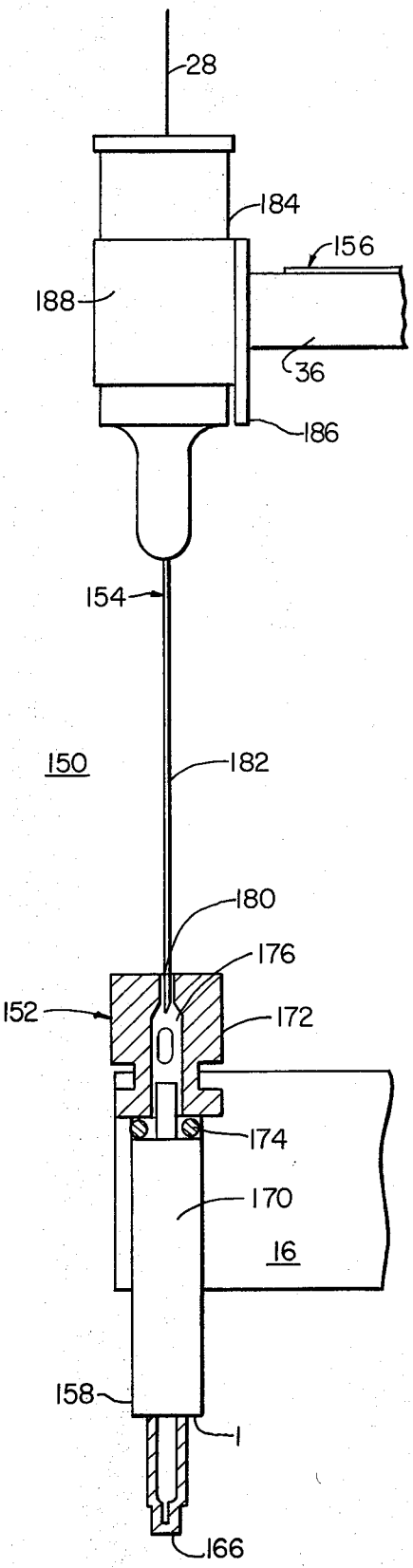
FIG. 5 is a schematic side elevational view of an alternative tip unit with the tip assembly shown in cross section.

Tip unit 150, FIG. 5 and 6, includes tip assembly 152, tip ministering assembly 154, and holding device 156. Tip assembly 152 includes tip element 158, which is split for almost its entire length into two halves, parts 160, 162, with a space 164 between them. Only the very bottom, 166, of tip element 158 connects parts 160 and 162. Part 160 is supplied power by electrode 18. They are separated through the rest of their extent by a spacer tube 170 of insulating material. Cap 172 is sealingly engaged with parts 160 and 162 by means of "O" ring 174 so that air or cooling fluid fed through pipe 38 enters cap 172 through hole 176 and flows downwardly to cool the interior area and the wire 28 in that area to prevent the insulation from sublimating or burning off.

Tip ministering assembly 154 is shown mounted in its retracted position with the tip 180 of its hollow tube 182 resting just inside of cap 172. Tube 182 extends from an enlarged portion 184, which serves to hold solvents such as flux solvents, and also to facilitate threading of wire 28 into tube 182. A pad 186 of magnetic material such as soft iron is mounted by means of a strap 188 to enlarged portion 184, and is attracted and held in place by means of a magnet 190 in holding device 156, which is mounted to frame 12 by magnet 36.

In operation, tip ministering assembly 154 may be moved away from magnet 36 and its tip 180 moved out of cap 172 for threading. Thread 28 is then fed into enlarged receptacle 184 and thence into tube 182. With wire 28 installed in tube 182, tube 182 is moved downwardly through cap 172 and spacer 170 to tip 166 and through the bottom of the tip. Then wire 28 is manually pushed through and out the bottom of tube 182 to extend beyond tip 166. It then may be held or bent at right angles while tip ministering assembly 154 is withdrawn to its retracted position as shown in FIGS. 5 and 6. Tip ministering assembly 154 remains in this position during the entire subsequent operation of the machine, with the wire 28 being fed through it.

Subsequently, if tip assembly 152 becomes contaminated or clogged, tip ministering assembly 154 is removed from magnet 36 and is moved gently downwardly through tip assembly 152. The lower end 180 of tube 182, especially if it has been pre-sharpened, acts to push and to cut or mill its way through the contaminants and clogs to clear tip assembly 152, without the need to remove the wire from tip assembly 152 or remove tip assembly 152 from the machine. Tip assembly 152 may be continuously cleansed by filling enlarged receptacle 184 with solvent. The inner diameter of tube 182 is typically 0.008 inch and wire 28 typically has an outer diameter of 0.004 inch, so that the very narrow space between them operates as a metering device as the wire moves through to deliver just a small amount of the solvent to and through the tip assembly for continuous cleaning thereof.

Other embodiments will occur to those skilled in the art and are within the following claims:

What is claimed is:

1. A method of bonding wire to a contact comprising: employing a first drive means to move a solder head to engage a wire in its tip with a contact to which it is to be bonded; heating said tip to heat the wire and contact and cause solder to flow; employing second drive means to apply an added force to increase the pressure of the tip on the wire and contact; removing the added force on and heating of the tip; and moving the solder head to remove the tip from the contact.

2. A bonding system comprising: a solder head; drive means for moving said head toward and away from a point to be soldered; a tip unit for receiving wire to be soldered and including a tip assembly having a first passage therethrough and a tip ministering assembly with a second passage for receiving wire and inserting it in said first passage; and holding means, for mounting proximate said tip assembly, said tip ministering assembly in a retracted position after threading with the wire passing through it to said tip assembly while allowing said tip ministering assembly to be readily released from said mounting means and moved into said first passage of said tip.

3. The system of claim 2 in which said tip ministering assembly includes a cutting edge at its lower end for cleaning the passage in said tip assembly without removing the wire.

4. A bonding system comprising: a solder head; drive means for moving said head toward and away from a point to be soldered; a tip unit for receiving wire to be soldered and including a tip assembly having a first passage therethrough and a tip ministering assembly with a second passage for receiving wire and inserting it in said first passage; and holding means, for mounting proximate said tip assembly, said tip ministering assembly in a retracted position after threading with the wire passing through it to said tip assembly; said tip ministering assembly including a cutting edge at its lower end for cleaning the passage in said tip assembly without removing the wire.

5. A bonding system comprising: a solder head; a tip unit for receiving wire to be soldered; a heater for heating said tip unit; drive means for moving said head toward and away from a member to be soldered and for increasing the force of said tip unit on the member to be soldered; means for causing said drive means to move said tip unit to engage said wire with said member and to energize said heater for a predetermined period of time; and means for causing said drive means to increase for a lesser period of time, during said predetermined period of time, the force between said tip unit and member.

6. The system of claim 5 in which said tip unit includes a tip assembly having a first passage therethrough, a tip ministering assembly with a second passage for receiving wire and leading it to said first passage; and holding means for mounting proximate said tip assembly said tip ministering assembly in a retracted position after threading, with the wire passing through it to said tip assembly.

7. The system of claim 6 in which said tip ministering assembly includes a cutting edge at its lower end for cleaning the passage in said tip assembly without removing the wire.

8. The system of claim 6 in which said tip ministering assembly includes an enlarged upper end for accepting the wire.

9. The system of claim 6 in which said tip ministering assembly includes a reservoir at its upper end for carrying cleaning solvent for delivery to said first passage through said second passage between said tip ministering assembly and wire therein.

10. The system of claim 6 in which said holding means includes magnetic means on said head and on said tip ministering assembly.

11. A bonding system comprising: a solder head having a soldering tip for making a bond; a bendable beam fixed to said head; sensor means actuated by said beam for indicating the condition of the bond; a gripping device fixed to said beam for gripping wire fed through said tip; automatic cycling means including: means for driving said solder head to engage said tip with a contact; means for heating said tip for a predetermined period of time; means for actuating said gripping device and retracting said solder head after said period of time; means for actuating said automatic cycling means; means, responsive to said means for sensing, for reactuating said cycling means upon said sensing means indicating an inadequate bond.

* * * * *